(12) United States Patent
Kuraguchi et al.

(10) Patent No.: US 10,026,804 B2
(45) Date of Patent: Jul. 17, 2018

(54) SEMICONDUCTOR DEVICE

(71) Applicant: Kabushiki Kaisha Toshiba, Minato-ku (JP)

(72) Inventors: Masahiko Kuraguchi, Yokohama (JP); Hisashi Saito, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/657,722

(22) Filed: Mar. 13, 2015

(65) Prior Publication Data

US 2015/0270379 A1 Sep. 24, 2015

(30) Foreign Application Priority Data

Mar. 19, 2014 (JP) ................. 2014-057281

(51) Int. Cl.
*H01L 29/778* (2006.01)
*H01L 29/06* (2006.01)
(Continued)

(52) U.S. Cl.
CPC ........ *H01L 29/0619* (2013.01); *H01L 29/063* (2013.01); *H01L 29/7786* (2013.01);
(Continued)

(58) Field of Classification Search
CPC . H01L 29/7783; H01L 29/402; H01L 29/0611
See application file for complete search history.

(56) References Cited

U.S. PATENT DOCUMENTS 9,263,533 B2 * 2/2016 Simin ................. H01L 29/4175

2003/0168704 A1 9/2003 Harada et al.
(Continued)

FOREIGN PATENT DOCUMENTS

JP 2003-68762 3/2003
JP 2007-134613 5/2004
(Continued)

OTHER PUBLICATIONS

Shuichi Yagi, et al., "GaN/AlGaN/GaN Polarization Junction Schottky Barrier Diode", the 58th Spring meeting, the Japan Society of Applied Physics, 2011, Total 1 Page.
(Continued)

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

A semiconductor device according to an embodiment includes: a first GaN based semiconductor layer; a second GaN based semiconductor layer disposed on the first GaN based semiconductor layer and having a bandgap larger than that of the first GaN based semiconductor layer; a source electrode disposed on the second GaN based semiconductor layer; a drain electrode disposed on the second GaN based semiconductor layer; a p-type third GaN based semiconductor layer disposed between the source electrode and the drain electrode on the second GaN based semiconductor layer; a gate electrode disposed on the third GaN based semiconductor layer; and a p-type fourth GaN based semiconductor layer disposed between the gate electrode and the drain electrode on the second GaN based semiconductor layer and disposed separated from the third GaN based semiconductor layer.

24 Claims, 8 Drawing Sheets

(51) Int. Cl.
*H01L 29/40* (2006.01)
*H01L 29/10* (2006.01)
*H01L 29/20* (2006.01)

(52) U.S. Cl.
CPC ...... *H01L 29/1066* (2013.01); *H01L 29/2003* (2013.01); *H01L 29/402* (2013.01); *H01L 29/404* (2013.01)

(56) References Cited

U.S. PATENT DOCUMENTS

| | | | |
|---|---|---|---|
| 2005/0189559 A1* | 9/2005 | Saito | H01L 29/1066 257/189 |
| 2007/0029599 A1 | 2/2007 | Nakajima | |
| 2010/0155780 A1* | 6/2010 | Machida | H01L 29/1066 257/192 |
| 2012/0267642 A1 | 10/2012 | Jeon et al. | |
| 2013/0062693 A1 | 3/2013 | Tanaka | |
| 2013/0082336 A1 | 4/2013 | Imada | |
| 2013/0140578 A1* | 6/2013 | Yu | H01L 29/7786 257/76 |
| 2013/0161692 A1* | 6/2013 | Koudymov | H01L 29/7787 257/192 |
| 2014/0001479 A1* | 1/2014 | Kudymov | H01L 29/404 257/76 |
| 2014/0091373 A1* | 4/2014 | Simin | G06F 17/5068 257/288 |
| 2014/0151749 A1* | 6/2014 | Jeon | H01L 29/66462 257/194 |

FOREIGN PATENT DOCUMENTS

| | | |
|---|---|---|
| JP | 2005-79346 A | 3/2005 |
| JP | 2005-244072 | 9/2005 |
| JP | 2006-513580 | 4/2006 |
| JP | 2009-231458 | 10/2009 |
| JP | 2009-246205 | 10/2009 |
| JP | 2010-147387 A | 7/2010 |
| JP | 2012-231108 | 11/2012 |
| JP | 2013-58662 | 3/2013 |
| JP | 2013-93482 | 5/2013 |
| JP | 2013-149851 | 8/2013 |
| JP | 2013-191637 A | 9/2013 |
| KR | 10-2013-0035173 A | 4/2013 |
| WO | 2004/068590 A1 | 8/2004 |
| WO | WO 2012/063329 A1 | 5/2012 |

OTHER PUBLICATIONS

Korean Office Action dated Jun. 30, 2016, issued in Korean Application No. 10-2015-0030373, with English translation.

* cited by examiner

SEMICONDUCTOR DEVICE

CROSS-REFERENCE TO RELATED APPLICATION

This application is based upon and claims the benefit of priority from Japanese Patent Application No. 2014-057281, filed on Mar. 19, 2014, the entire contents of which are incorporated herein by reference.

FIELD

Embodiments described herein relate generally a to semiconductor device.

BACKGROUND

A semiconductor device such as a switching device and a diode is used for a circuit such as a switching power source and an inverter. These semiconductor devices are required to have high breakdown voltage and low on-resistance. Further, a relation between the breakdown voltage and the on-resistance has a trade-off relation determined by a device material.

By the progress of technological development till today, low on-resistance of a semiconductor device nearly up to a limit of silicon has been realized. In order to further improve the breakdown voltage and further reduce the on-resistance, it is necessary to change the device material from silicon. By adopting a wide bandgap semiconductor such as GaN based semiconductor like GaN and AlGaN or Silicon Carbide (SiC) as the switching device material, the trade-off relation determined by the material can be improved and it is possible to dramatically raise the breakdown voltage and reduce the on-resistance.

DETAILED DESCRIPTION

Figure 1:
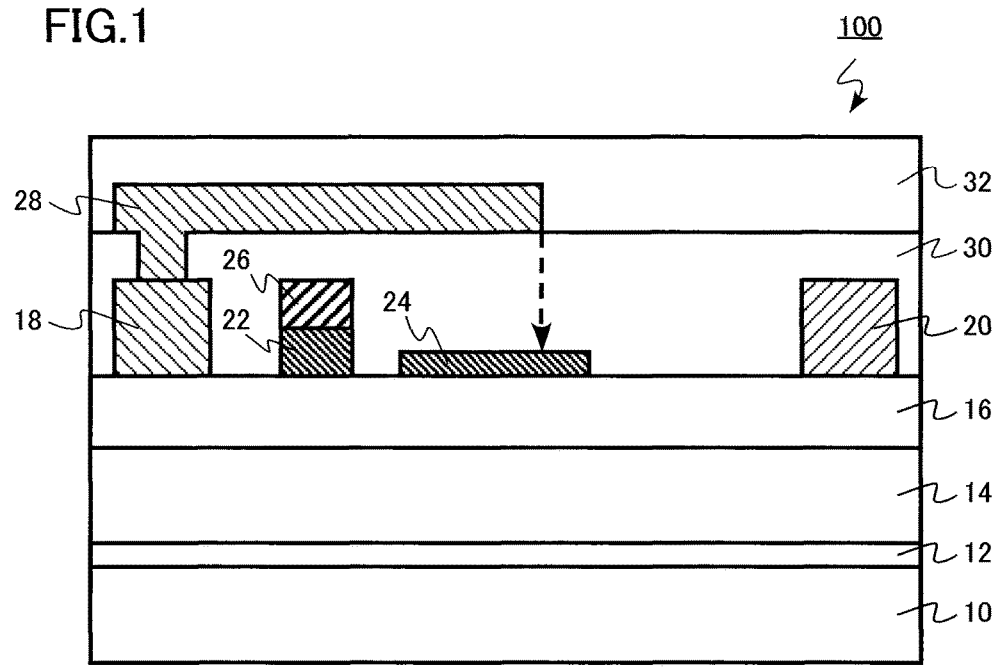
FIG. 1 is a schematic cross-sectional view illustrating a semiconductor device according to a first embodiment.

A semiconductor device according to an embodiment includes: a first GaN based semiconductor layer; a second GaN based semiconductor layer disposed on the first GaN based semiconductor layer and having a bandgap larger than a bandgap of the first GaN based semiconductor layer; a source electrode disposed on the second GaN based semiconductor layer; a drain electrode disposed on the second GaN based semiconductor layer; a third p-type GaN based semiconductor layer disposed between the source electrode and the drain electrode on the second GaN based semiconductor layer; and a gate electrode disposed on the third GaN based semiconductor layer; and a fourth p-type GaN based semiconductor layer disposed between the gate electrode and the drain electrode on the second GaN based semiconductor layer, and disposed separated from the third GaN based semiconductor layer.

In the present specification, note that same or equivalent components are denoted by same reference signs, and there may be a case where repetition of the description is omitted.

In the present specification, "GaN based semiconductor" is a generic term for GaN (gallium nitride), AlN (aluminum nitride), InN (indium nitride), and a semiconductor including these intermediate compositions.

In the present specification, "undoped" means that impurity concentration is $1 \times 10^{15}$ cm$^{-3}$ or less.

In the present specification, "acceptor" means a p-type impurity activated inside the semiconductor.

In the present specification, an upward direction in the drawing is described as "up" and a downward direction in the drawing is described as "down" in order to show a positional relation of components and the like. In the present specification, note that the concepts of the "up" and "down" do not necessarily indicate a relation with a gravity direction.

First Embodiment

A semiconductor device according to a present embodiment includes: a first GaN based semiconductor layer; a second GaN based semiconductor layer disposed on the first GaN based semiconductor layer and having a bandgap larger than a bandgap of the first GaN based semiconductor layer; a source electrode disposed on the second GaN based semiconductor layer; a drain electrode disposed on the second GaN based semiconductor layer; and a p-type third GaN based semiconductor layer disposed between the source electrode and the drain electrode on the second GaN based semiconductor layer; a gate electrode disposed on the third GaN based semiconductor layer; a p-type fourth GaN based semiconductor layer disposed between the gate electrode and the drain electrode on the second GaN based semiconductor layer on an opposite side of the first GaN based semiconductor layer, and separated from the third GaN based semiconductor layer.

FIG. 1 is a schematic cross-sectional view of a semiconductor device according to the present embodiment. The semiconductor device according to the present embodiment is an HEMT (High Electron Mobility Transistor) using the GaN based semiconductor.

As illustrated in FIG. 1, a semiconductor device (HEMT) 100 includes a substrate 10, a buffer layer 12, a channel layer (first GaN based semiconductor layer) 14, a barrier layer (second GaN based semiconductor layer) 16, a source electrode 18, a drain electrode 20, a cap layer (third GaN based semiconductor layer) 22, a resurf layer (fourth GaN based semiconductor layer) 24, a gate electrode 26, and a source field plate electrode (first field plate electrode) 28. An insulating film 30 is disposed between the source field plate electrode 28 and each of the gate electrode 26 and the resurf layer 24. Further, an insulating film 32 is disposed on the source field plate electrode 28.

The substrate 10 is formed of, for example, silicon (Si). Besides silicon, sapphire ($Al_2O_3$) or silicon carbide (SiC) may be also applicable, for example.

The buffer layer 12 is disposed on the substrate 10. The buffer layer 12 has a function to reduce lattice misalignment between the substrate 10 and the channel layer 14. The buffer layer 12 is formed of, for example, a multi-layer structure of aluminum nitride gallium ($Al_WGa_{1-W}N$ (0<W<1)).

The channel layer 14 is disposed on the buffer layer 12. The channel layer 14 is, for example, undoped $Al_XGa_{1-X}N$ (0≤X<1). More specifically, the channel layer 14 is undoped GaN, for example. The channel layer 14 has film thickness of 0.5 µm or more and 3 µm or less, for example.

The barrier layer 16 is disposed on the channel layer 14. The barrier layer 16 has the bandgap larger than the bandgap of the channel layer 14. The barrier layer 16 is, for example, undoped $Al_YGa_{1-Y}N$ (0<Y≤1, X<Y). More specifically, the barrier layer 16 is undoped $Al_{0.2}Ga_{0.8}N$, for example. The barrier layer 16 has the film thickness of 15 nm or more and 50 nm or less, for example.

A heterojunction interface is provided between the channel layer 14 and the barrier layer 16. When the HEMT 100 is turned on, two-dimensional electron gas (2DEG) is formed at the heterojunction interface and becomes carrier.

The source electrode 18 and the drain electrode 20 are formed on the barrier layer 16. The source electrode 18 and the drain electrode 20 are, for example, metal electrodes and the metal electrode is, for example, a stacked structure of titanium (Ti) and aluminum (Al). Preferably, ohmic contact is provided between the barrier layer 16 and each of the source electrode 18 and the drain electrode 20. A distance between the source electrode 18 and the drain electrode 20 is, for example, 5 µm or more and 30 µm or less.

A p-type cap layer 22 is disposed between the source electrode 18 and the drain electrode 20 on the barrier layer 16. The cap layer 22 has a function to raise electric potential of the channel layer 14 and increase a threshold value of the HEMT 100.

The cap layer 22 is, for example, p-type $Al_UGa_{1-U}N$ (0≤U<1). More specifically, the cap layer 22 is p-type GaN, for example. The cap layer 22 has the film thickness of 50 nm or more and 20 nm or less, for example.

The p-type impurity included in the cap layer 22 is, for example, Mg (magnesium). An atomic percentage of the p-type impurity included in the cap layer 22 is preferably $1 \times 10^{17}$ cm$^{-3}$ or more, more preferably, $1 \times 10^{18}$ cm$^{-3}$ or more from the standpoint of raising the electric potential of the channel layer 14. The cap layer 22 is a single crystal.

The gate electrode 26 is disposed on the cap layer 22. The gate electrode 26 is, for example, a metal electrode. The metal electrode is, for example, titanium nitride (TiN). The ohmic contact is, preferably, provided between the gate electrode 26 and the cap layer 22.

The p-type resurf (RESURF: Reduced Surface Field) layer 24 is disposed between the gate electrode 26 and the drain electrode 20 on the barrier layer 16. The resurf layer 24 is disposed physically separated from the cap layer 22.

The resurf layer 24 is, for example, p-type $Al_ZGa_{1-Z}N$ (0≤Z<1). More specifically, the resurf layer is p-type GaN, for example. The resurf layer 24 includes a p-type impurity. The p-type impurity is, for example, magnesium (Mg).

The resurf layer 24 is a floating layer. In other words, the resurf layer is not electrically connected to a grounding wire, a power source, a signal source, and the like. Therefore, the resurf layer 24 is not electrically connected to the source electrode 18, drain electrode 20, and gate electrode 26.

The resurf layer 24 has a function to alleviate mainly a lateral electric field. According to the present embodiment, the resurf layer 24 is disposed directly contacting the barrier layer 16. Since the resurf layer 24 is the floating layer, hole injection from the resurf layer 24 does not occur. Therefore, a switch speed is not degraded by presence of the resurf layer 24.

The insulating film 30 is disposed on the gate electrode 26 and the resurf layer 24. The insulating film 30 is, for example, a silicon oxide film or a silicon nitride film.

The source field plate electrode (first field plate electrode) 28 is disposed, interposing the insulating film 30 in a space with the gate electrode 26 and a space with the resurf layer 24. As indicated by a dotted arrow in FIG. 1, the resurf layer 24 is located between the barrier layer 16 and an end portion on the drain electrode 20 side of the source field plate electrode 28. In other words, the resurf layer 24 is located just below the end portion on the drain electrode 20 side of the source field plate electrode 28.

The source field plate electrode 28 is electrically connected to the source electrode 18. The source field plate electrode 28 has a function to alleviate mainly the lateral electric field.

The insulating film 32 is disposed on the source field plate electrode 28. The insulating film 32 is, for example, a silicon oxide film or a silicon nitride film.

Next, an exemplary manufacturing method for the semiconductor device according to the present embodiment will be described. FIGS. 2 to 6 are schematic cross-sectional views illustrating the semiconductor device in process of manufacture in the manufacturing method for the semiconductor device according to the present embodiment.

First, the substrate 10, for example, a Si substrate is prepared. Next, the buffer layer 12 is grown on the Si substrate by epitaxial growth.

Next, the undoped GaN to be the channel layer 14 and the undoped $Al_{0.2}Ga_{0.8}N$ to be the barrier layer 16 are formed on the buffer layer 12 by the epitaxial growth.

Figure 2:
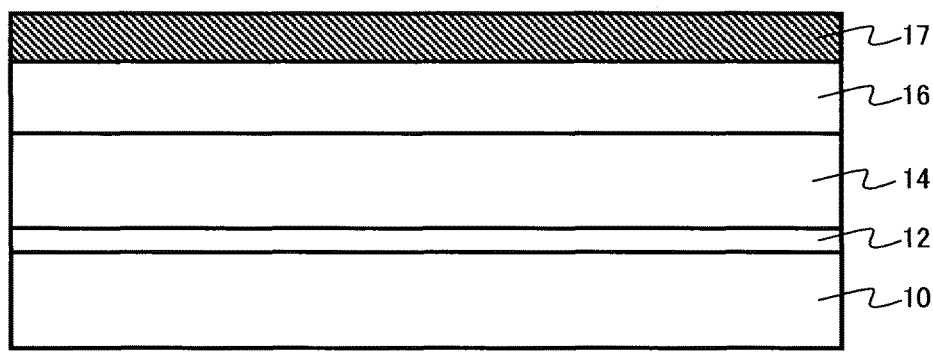
FIG. 2 is a schematic cross-sectional view illustrating the semiconductor device in process of manufacture in a manufacturing method for the semiconductor device according to the first embodiment.

Next, p-type GaN 17 to be the cap layer 22 and resurf layer 24 later is formed by the epitaxial growth (FIG. 2).

Figure 3:
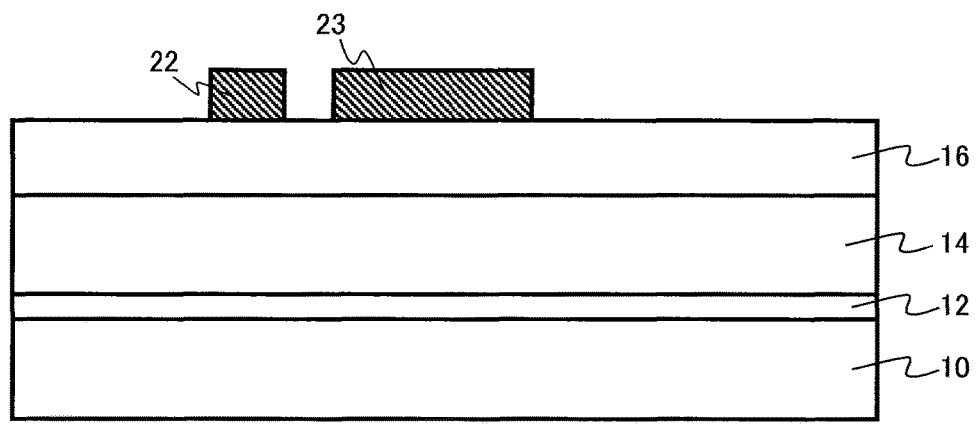
FIG. 3 is a schematic cross-sectional view illustrating the semiconductor device in process of manufacture in the manufacturing method for the semiconductor device according to the first embodiment.

Next, the cap layer 22 and a future resurf layer 23 to be the resurf layer 24 later are formed by patterning the p-type GaN 17 (FIG. 3).

Figure 4:
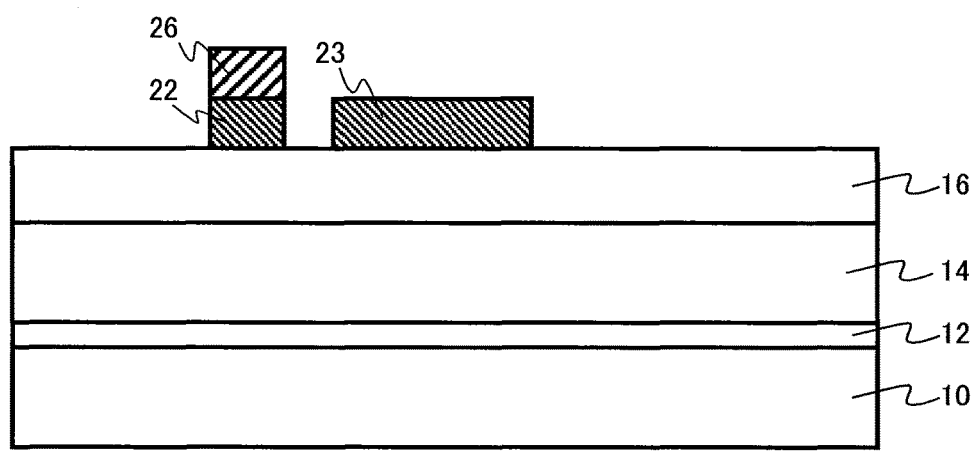
FIG. 4 is a schematic cross-sectional view illustrating the semiconductor device in process of manufacture in the manufacturing method for the semiconductor device according to the first embodiment.

Next, the gate electrode 26 made of TiN is formed on the cap layer 22 by a sputtering method and etching (FIG. 4).

Figure 5:
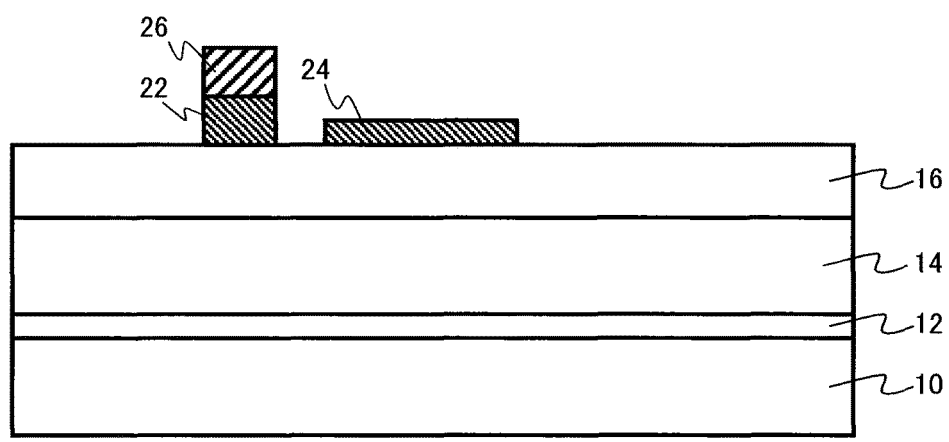
FIG. 5 is a schematic cross-sectional view illustrating the semiconductor device in process of manufacture in the manufacturing method for the semiconductor device according to the first embodiment.

Next, an area other than the future resurf layer 23 is masked, and the future resurf layer 23 is thinned by etching, and the resurf layer 24 is formed (FIG. 5).

Figure 6:
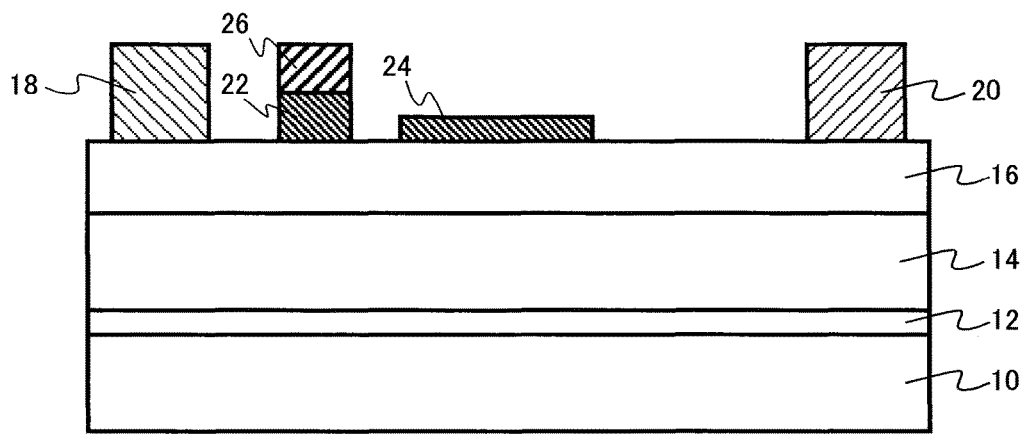
FIG. 6 is a schematic cross-sectional view illustrating the semiconductor device in process of manufacture in the manufacturing method for the semiconductor device according to the first embodiment.

Next, the source electrode 18 and the drain electrode 20 having the stacked structure of titanium (Ti) and aluminum (Al) are formed on the barrier layer 16 by a liftoff process (FIG. 6).

After that, the insulating film 30, source field plate electrode 28, and insulating film 32 are formed, and the semiconductor device 100 illustrated in FIG. 1 is manufactured.

Next, function and effects of the semiconductor device 100 according to the present embodiment will be described.

Figure 7:
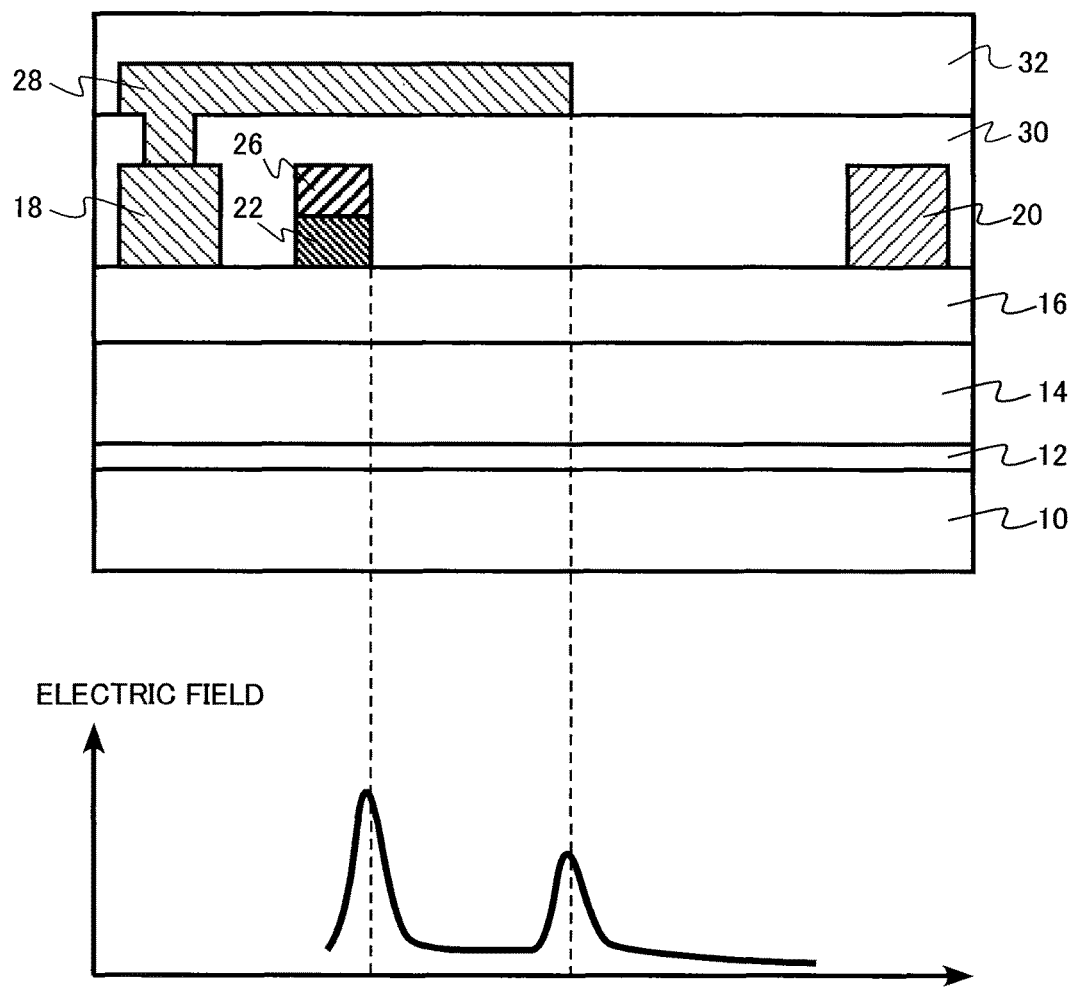
FIG. 7 is an explanatory diagram for function and effects of the semiconductor device according to the first embodiment.
Figure 8:
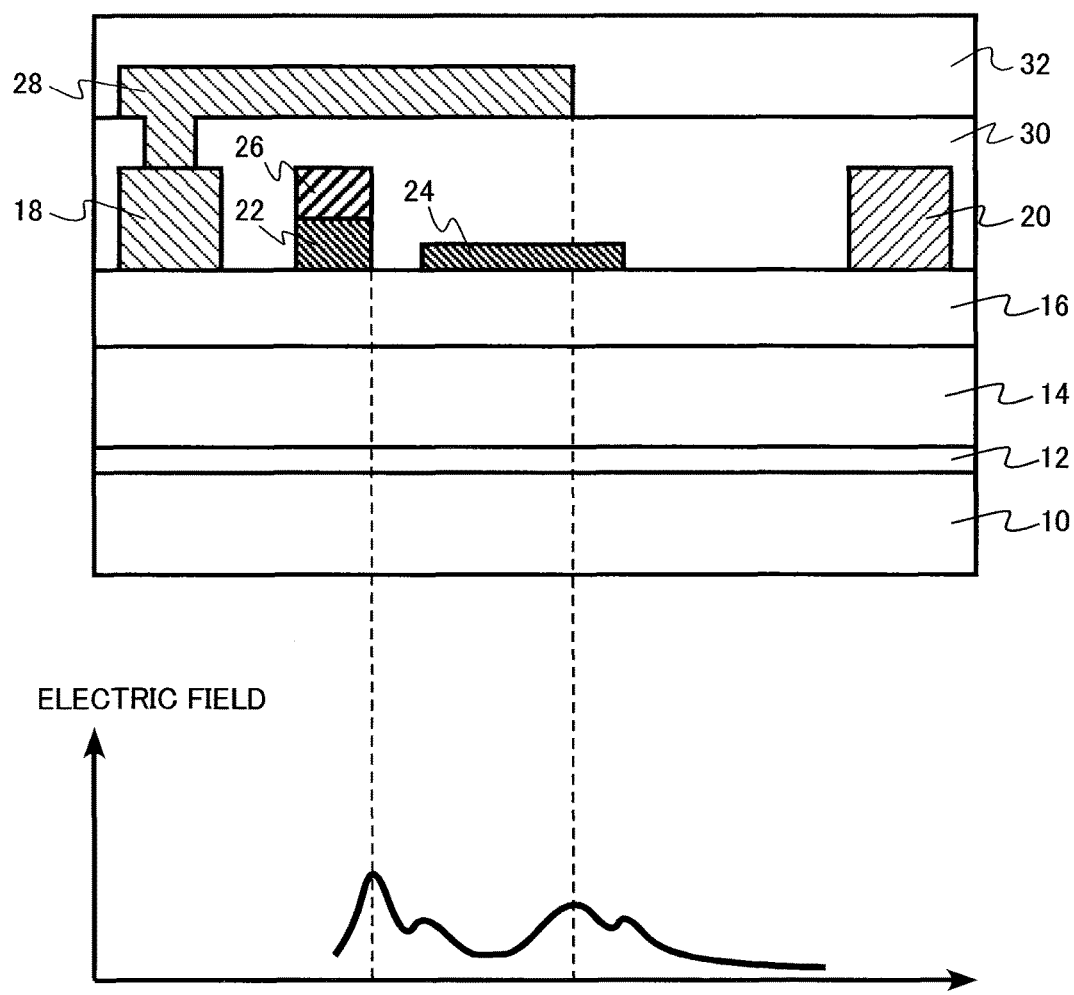
FIG. 8 is an explanatory diagram for the function and effects of the semiconductor device according to the first embodiment.

FIGS. 7 and 8 are explanatory diagrams for the function and effects of the semiconductor device according to the present embodiment. FIG. 7 is the diagram illustrating the HEMT without including the resurf layer, and FIG. 8 is the diagram illustrating the HEMT including the resurf layer according to the present embodiment. In the respective cases, distribution of electric field strength when the HEMT is turned off will be schematically illustrated.

As illustrated in FIG. 7, the electric field concentrates on two points, namely, the end portion on the drain electrode 20 side of the gate electrode 26 and the end portion on the drain electrode 20 side of the source field plate electrode 28 at which peaks of the electric field strength appear. The concentrated electric field is mainly the lateral electric field. Thus, the insulating film and the semiconductor may be damaged and the breakdown voltage may be deteriorated at the places where the electric field is concentrated. The reason for such electric field concentration at the end portions of the electrodes as shown in FIG. 7 is considered to be discontinuous depletion of a two-dimensional electron gas generated at an interface between the barrier layer 16 and the channel layer 14.

As illustrated in FIG. 8, in the case where the resurf layer 24 is provided, the peaks of the electric field strength at the end portion on the drain electrode 20 side of the gate electrode 26 and the end portion on the drain electrode 20 side of the source field plate electrode 28 become gentle, and electric field strength becomes smaller compared to the case without including the resurf layer 24. The reason is considered that discontinuity of expansion of a depleted layer is reduced by positive charge inside the floating resurf layer 24.

Meanwhile, preferably, area density of an acceptor of the resurf layer 24 is lower than the area density of the two-dimensional electron gas generated at the interface between the barrier layer 16 and the channel layer 14 in an area where neither the resurf layer 24 nor the gate electrode 26 is provided. When the area density of the acceptor of the resurf layer 24 becomes higher than the area density of the above-mentioned two-dimensional electron gas, the density of the two-dimensional electron gas may be decreased and the on-resistance may be increased.

Further, preferably, the area density of the acceptor of the resurf layer 24 is higher than 10% of the area density of the two-dimensional electron gas generated at the interface between the barrier layer 16 and the channel layer 14 in the area where neither the resurf layer 24 nor the gate electrode 26 is provided. When the area density of the acceptor of the resurf layer 24 becomes lower than the above-mentioned area density, a sufficient effect of electric field alleviation may not be obtained.

For instance, in the case where the channel layer 14 is undoped GaN and the barrier layer 16 is undoped $Al_YGa_{1-Y}N$ (0<Y≤1), the area density of the two-dimensional electron gas is represented by $y \times 4 \times 10^{13}$ [cm$^{-2}$]. Therefore, in this case, the area density of the acceptor of the resurf layer 24 is preferably lower than $y \times 4 \times 10^{13}$ [cm$^{-2}$] and higher than $y \times 0.4 \times 10^{13}$ [cm$^{-2}$].

Provided that the resurf layer 24 has the film thickness of d [cm] and the acceptor density of $N_A$ [cm$^{-3}$], the area density of the acceptor of the resurf layer 24 is represented by $d \times N_A$ [cm$^{-2}$]. Therefore, preferably, a relation of a following expression is satisfied:

$$y \times 0.4 \times 10^{13} < d \times N_A < y \times 4 \times 10^{13} \quad \text{(Expression 1)}.$$

Note that an activation rate of the p-type impurity inside a p-type GaN based semiconductor is more or less 10%. Therefore, provided that the atomic percentage of the p-type impurity is $N_P$ [cm$^{-2}$], the above (Expression 1) is changed to:

$$y \times 4 \times 10^{13} < d \times N_P < y \times 40 \times 10^{13} \quad \text{(Expression 2)}.$$

Preferably, the acceptor density of the resurf layer 24 is $1 \times 10^{16}$ cm$^{-3}$ or more and $1 \times 10^{18}$ cm$^{-3}$ or less. Preferably, the atomic percentage of the p-type impurity of the resurf layer 24 is $1 \times 10^{17}$ cm$^{-3}$ or more and $1 \times 10^{19}$ cm$^{-3}$ or less. Further, preferably, the film thickness of the resurf layer 24 is 10 nm or more and 100 nm or less. By forming the resurf layer 24 within the ranges of the above acceptor density or atomic percentage of the p-type impurity and the above film thickness, the resurf layer 24 capable of providing sufficient effects of electric field alleviation can be easily formed.

Preferably, the film thickness of the resurf layer 24 is thinner than the film thickness of the cap layer 22 from the standpoint of satisfying the (Expression 1) or (Expression 2). Further, preferably, the acceptor density and atomic percentage of the p-type impurity of the resurf layer 24 is lower than the acceptor density and atomic percentage of the p-type impurity of cap layer 22 from the same standpoint.

Further, preferably, the atomic percentage (p-type impurity concentration) of the resurf layer 24 is same as the atomic percentage (p-type impurity concentration) of the cap layer 22 and also the film thickness of the resurf layer 24 is thinner than the film thickness of the cap layer 22. According to the manufacturing method illustrated in FIGS. 2 to 6, the resurf layer 24 and the cap layer 22 layer can be easily formed from the same p-type GaN based semiconductor layers. Note that a concept of the wording "the p-type impurity concentration is same" allows an error caused by production tolerance.

As described, according to the semiconductor device of the present embodiment, the semiconductor device achieving to have high breakdown voltage can be provided by the effect of lateral electric field alleviation by the resurf layer 24.

Second Embodiment

A semiconductor device according to a present embodiment is same as a semiconductor device according to a first embodiment except for that an end portion of a fourth GaN based semiconductor layer is sloped. Therefore, repetition of describing the matters same as the first embodiment will be omitted.

Figure 9:
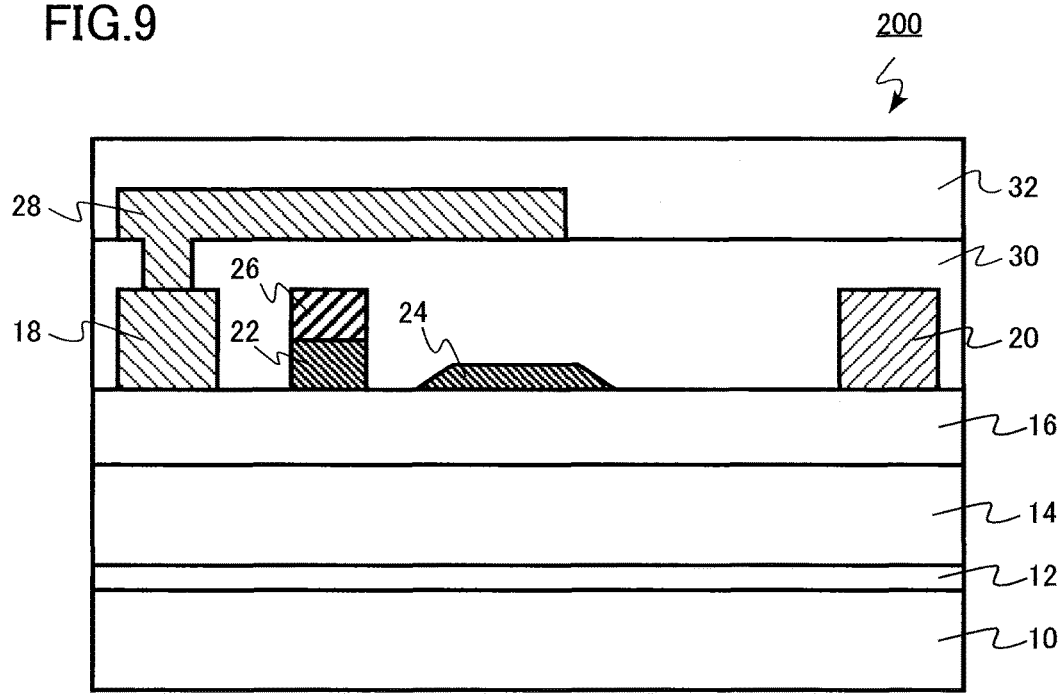
FIG. 9 is a schematic cross-sectional view illustrating a semiconductor device according to a second embodiment.

FIG. 9 is a schematic cross-sectional view illustrating the semiconductor device according to the present embodiment. The semiconductor device according to the present embodiment is an HEMT using a GaN based semiconductor.

As illustrated in FIG. 9, end portions of a resurf layer 24 of a semiconductor device (HEMT) 200 are sloped. In other words, side walls of the resurf layer 24 are formed in sloped surfaces.

According to the present embodiment, an effect of electric field alleviation by the resurf layer 24 is more increased, and the semiconductor device having higher breakdown voltage can be provided by suppressing concentration of an electric field at the end portions of the resurf layer. Further, more preferably, the side walls of the resurf layer 24 are sloped at a gentle angle toward a top portion of the resurf layer 24 from the standpoint of increasing the effect of electric field alleviation.

Third Embodiment

A semiconductor device according to a present embodiment is same as a first embodiment except for further including a fifth p-type GaN based semiconductor layer disposed between a gate electrode and a fourth GaN based semiconductor layer or between the fourth GaN based semiconductor layer and a drain electrode on a second GaN based semiconductor layer on an opposite side of a first GaN based semiconductor layer, and separated from a third GaN based semiconductor layer and the fourth GaN based semiconductor layer. Therefore, repetition of describing the matters same as the first embodiment will be omitted.

Figure 10:
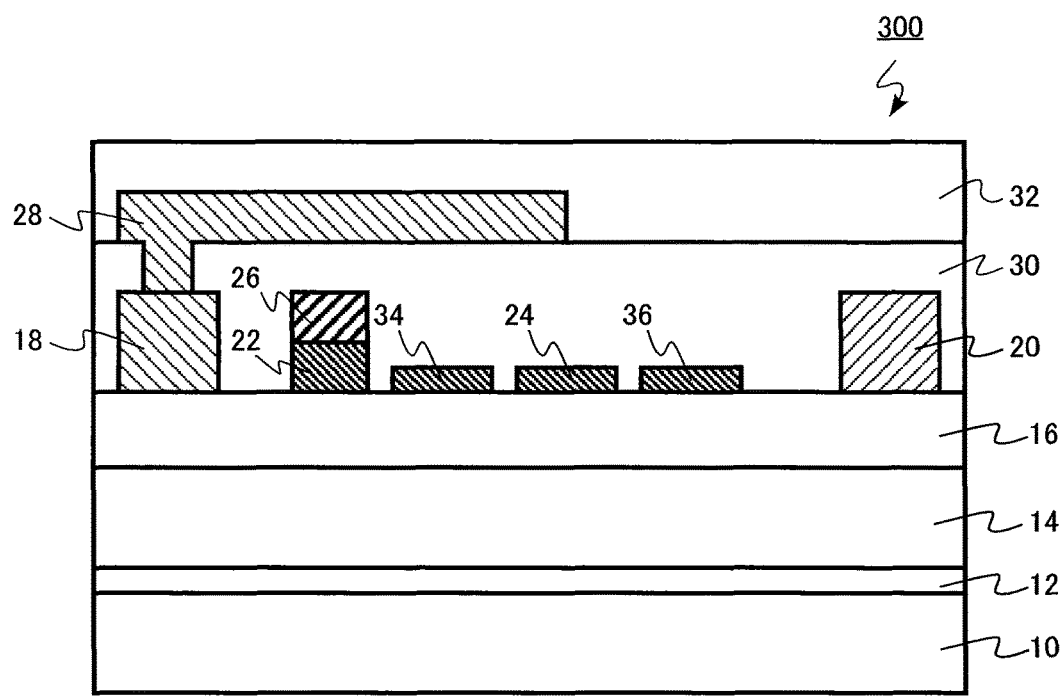
FIG. 10 is a schematic cross-sectional view illustrating a semiconductor device according to a third embodiment.

FIG. 10 is a schematic cross-sectional view illustrating a semiconductor device according to the present embodiment. The semiconductor device according to the present embodiment is an HEMT using a GaN based semiconductor.

As illustrated in FIG. 10, a semiconductor device (HEMT) 300 includes a plurality of resurf layers, namely, a resurf layer (fourth GaN based semiconductor layer) 24, a resurf layer (fifth GaN based semiconductor layer) 34, and a resurf layer (fifth GaN based semiconductor layer) 36.

The resurf layer (fifth GaN based semiconductor layer) 34 is disposed between a gate electrode 26 and the resurf layer 24 on a barrier layer 16. The resurf layer 34 is separated from a cap layer 22 and the resurf layer 24. Further, the resurf layer (fifth GaN based semiconductor layer) 36 is disposed between the resurf layer 24 and the drain electrode 20 on the barrier layer 16. The resurf layer 36 is separated from the cap layer 22 and the resurf layer 24.

According to the present embodiment, the plurality of resurf layers is disposed between the gate electrode 26 and the drain electrode 20 on the barrier layer 16, thereby further alleviating a lateral electric field, and achieving to provide the semiconductor device having high breakdown voltage.

Fourth Embodiment

A semiconductor device according to a present embodiment is same as a first embodiment except for including a sixth i-type GaN based semiconductor layer between a second GaN based semiconductor layer and a fourth GaN based semiconductor layer. Therefore, repetition of describing the matters same as the first embodiment will be omitted.

Figure 11:
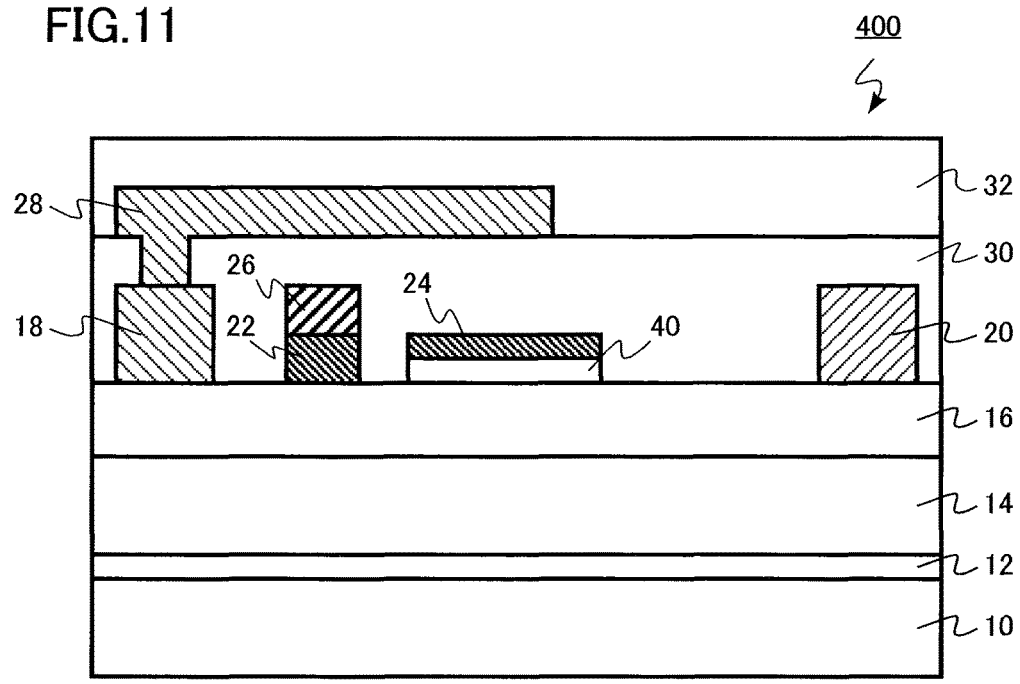
FIG. 11 is a schematic cross-sectional view illustrating a semiconductor device according to a fourth embodiment.

FIG. 11 is a schematic cross-sectional view illustrating a semiconductor device according to the present embodiment. The semiconductor device according to the present embodiment is an HEMT using a GaN based semiconductor.

As illustrated in FIG. 11, a semiconductor device (HEMT) 400 includes an i (intrinsic) type GaN layer (sixth GaN based semiconductor layer) 40 between a barrier layer 16 and a resurf layer 24.

According to the semiconductor device of the present embodiment, the semiconductor device achieving to have high breakdown voltage can be provided by an effect of lateral electric field alleviation by the resurf layer 24, same as the first embodiment.

Fifth Embodiment

A semiconductor device according to a present embodiment is same as a first embodiment except for further including a second field plate electrode, interposing an insulating film in a space with a first field plate electrode and also interposing an insulating film in a space with a fourth GaN based semiconductor layer, and the fourth GaN based semiconductor layer is located between a second GaN based semiconductor layer and an end portion on a drain electrode side of the second field plate electrode. Therefore, repetition of describing the matters same as the first embodiment will be omitted.

Figure 12:
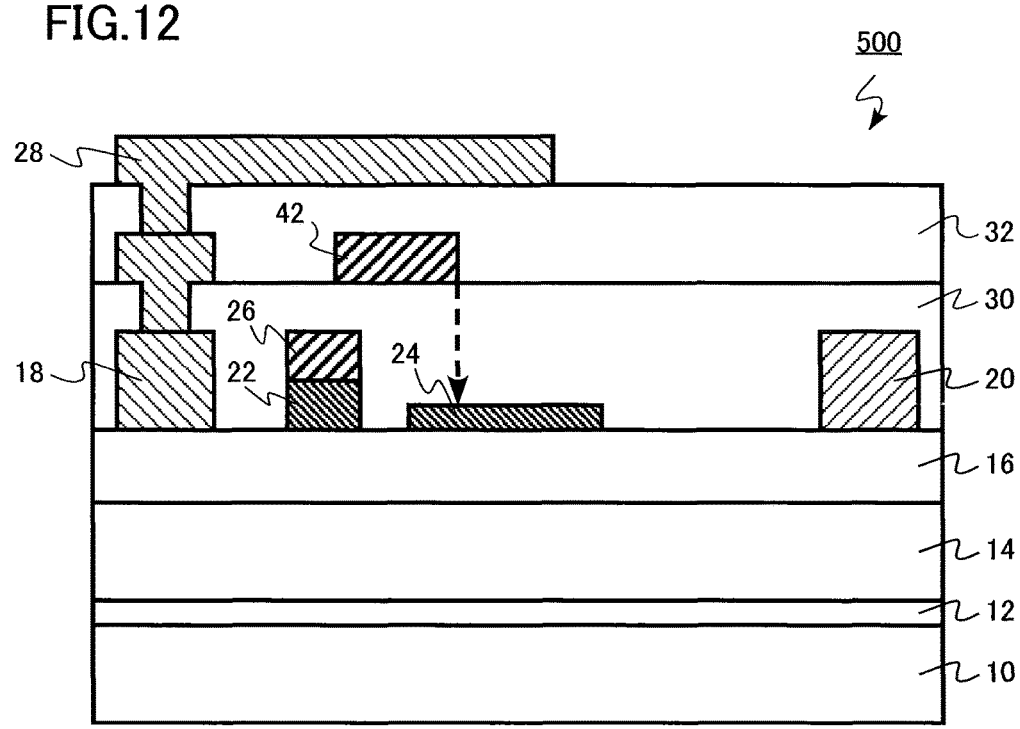
FIG. 12 is a schematic cross-sectional view illustrating a semiconductor device according to a fifth embodiment.

FIG. 12 is a schematic cross-sectional view illustrating the semiconductor device according to the present embodiment. The semiconductor device according to the present embodiment is an HEMT using a GaN based semiconductor.

As illustrated in FIG. 12, a semiconductor device (HEMT) 500 includes a gate field plate electrode (second field plate electrode) 42, interposing an insulating film 32 in the space with a source field plate electrode (first field plate electrode) 28 and also interposing an insulating film 30 in the space with a resurf layer 24. As indicated by a dotted arrow in FIG. 1, the resurf layer 24 is located between a barrier layer 16 (second GaN based semiconductor layer) and an end portion on a drain electrode 20 side of the gate field plate electrode 42.

Therefore, concentration of a lateral electric field at the end portion on the drain electrode 20 side of the gate field plate electrode 42 is alleviated by the resurf layer 24.

As described above, according to the semiconductor device of the present embodiment, the semiconductor device achieving to have high breakdown voltage can be provided by including the gate field plate electrode 42, in addition to effects of the first embodiment.

Sixth Embodiment

A semiconductor device according to a present embodiment is same as a first embodiment except for not including a first field plate electrode. Therefore, repetition of describing the matters same as the first embodiment will be omitted.

Figure 13:
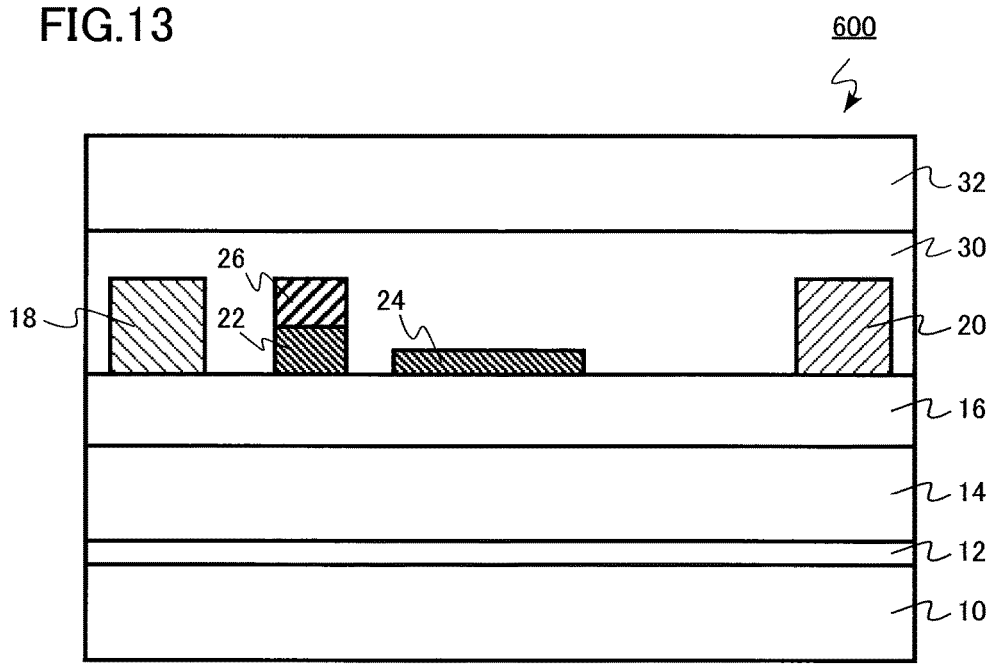
FIG. 13 is a schematic cross-sectional view illustrating a semiconductor device according to a sixth embodiment.

FIG. 13 is a schematic cross-sectional view illustrating the semiconductor device according to the present embodiment. The semiconductor device according to the present embodiment is an HEMT using a GaN based semiconductor.

As illustrated in FIG. 13, a semiconductor device (HEMT) 600 does not include a source field plate electrode, different from an HEMT 100 of the first embodiment.

According to the semiconductor device of the present embodiment, concentration of an electric field at an end portion on a drain electrode 20 side of a gate electrode 26 is alleviated by a resurf layer 24. Therefore, according to the present embodiment, the semiconductor device capable of reducing parasitic capacitance in a space with the field plate electrode and also achieving to have high breakdown voltage can be provided by an effect of lateral electric field alleviation by the resurf layer 24.

According to the embodiments, examples in which GaN or AlGaN is applied as the material of the GaN based semiconductor layer have been described, but InGaN, InAlN, and InAlGaN including indium (In), for example, may be applicable, too. Further, AlN may be applied as the material of the GaN based semiconductor layer.

Additionally, according to the embodiments, the example of applying the undoped AlGaN as the barrier layer has been described, but n-type AlGaN may be applicable, too.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first GaN based semiconductor layer;
a second GaN based semiconductor layer disposed on the first GaN based semiconductor layer, the second GaN based semiconductor layer having a bandgap larger than a bandgap of the first GaN based semiconductor layer;
a source electrode disposed on the second GaN based semiconductor layer;
a drain electrode disposed on the second GaN based semiconductor layer;
a p-type third GaN based semiconductor layer disposed between the source electrode and the drain electrode on the second GaN based semiconductor layer;
a gate electrode disposed on the third GaN based semiconductor layer;
a p-type fourth GaN based semiconductor layer disposed between the gate electrode and the drain electrode directly on the second GaN based semiconductor layer, the fourth GaN based semiconductor layer disposed separated from the third GaN based semiconductor layer;
a first insulating film disposed on the fourth GaN based semiconductor layer; and
a first field plate electrode disposed interposing the first insulating film in a space with the fourth GaN based semiconductor layer, the first field plate electrode being separated from the fourth GaN based semiconductor layer, and the first field plate electrode electrically connected to the source electrode,
wherein the fourth GaN based semiconductor layer is located between the second GaN based semiconductor layer and a first end portion on the drain electrode side of the first field plate electrode, a line drawn from an exterior side surface of the first end portion vertical to an interface between the first GaN based semiconductor layer and the second GaN based semiconductor layer crosses the fourth GaN based semiconductor layer.

2. The device according to claim 1, wherein the fourth GaN based semiconductor layer is a floating layer.

3. The device according to claim 1, wherein the fourth GaN based semiconductor layer has an area density of an acceptor lower than an area density of two-dimensional electron gas generated at an interface between the first GaN based semiconductor layer and the second GaN based semiconductor layer.

4. The device according to claim 1, wherein an end portion of the fourth GaN based semiconductor layer is sloped.

5. The device according to claim 1, wherein the third GaN based semiconductor layer and the fourth GaN based semiconductor layer have a substantially same p-type impurity concentration, and the fourth GaN based semiconductor layer has a film thickness thinner than a film thickness of the third GaN based semiconductor layer.

6. The device according to claim 1, further comprising: a p-type fifth GaN based semiconductor layer disposed between the gate electrode and the fourth GaN based semiconductor layer or between the fourth GaN based semiconductor layer and the drain electrode, the fifth GaN based semiconductor layer disposed on the second GaN based semiconductor layer on an opposite side of the first GaN based semiconductor layer, the fifth GaN based semiconductor layer being separated from the third GaN based semiconductor layer and the fourth GaN based semiconductor layer.

7. The device according to claim 1, wherein the fourth GaN based semiconductor layer has a film thickness of 10 nm or more and 100 nm or less.

8. The device according to claim 1, further comprising a second field plate electrode disposed interposing a second insulating film in a space with the first field plate electrode and further interposing the first insulating film in a space with the fourth GaN based semiconductor layer,
wherein the fourth GaN based semiconductor layer is disposed between the second GaN based semiconductor layer and a second end portion on the drain electrode side of the second field plate electrode, a line drawn from the second end portion vertical to an interface between the first GaN based semiconductor layer and the second GaN based semiconductor layer crosses the fourth GaN based semiconductor layer.

9. The device according to claim 1, wherein the fourth GaN based semiconductor layer has an area density of an acceptor higher than 10% of an area density of two-dimensional electron gas generated at the interface between the first GaN based semiconductor layer and the second GaN based semiconductor layer in an area where neither the fourth GaN based semiconductor layer nor the gate electrode is provided.

10. The device according to claim 1, wherein an acceptor density of the fourth GaN based semiconductor layer is $1 \times 10^{16}$ cm$^{-3}$ or more and $1 \times 10^{18}$ cm$^{-3}$ or less.

11. The device according to claim 1, wherein an atomic density of the fourth GaN based semiconductor layer is $1 \times 10^{17}$ cm$^{-3}$ or more and $1 \times 10^{19}$ cm$^{-3}$ or less.

12. The device according to claim 1, wherein the first field plate electrode extends in a direction from the source electrode towards the drain electrode so as to overlap at least a portion of each of the source electrode, the third GaN based semiconductor layer, the gate electrode, and the fourth GaN based semiconductor layer in the direction from the source electrode towards the drain electrode.

13. The device according to claim 1, wherein a distance between the source electrode and the drain electrode is 5 μm or more and 30 μm or less.

14. A semiconductor device, comprising:
a first GaN based semiconductor layer;
a second GaN based semiconductor layer disposed on the first GaN based semiconductor layer, the second GaN based semiconductor layer having a bandgap larger than a bandgap of the first GaN based semiconductor layer;
a source electrode disposed on the second GaN based semiconductor layer;
a drain electrode disposed on the second GaN based semiconductor layer;
a p-type third GaN based semiconductor layer disposed between the source electrode and the drain electrode on the second GaN based semiconductor layer;
a gate electrode disposed on the third GaN based semiconductor layer;

a p-type fourth GaN based semiconductor layer disposed between the gate electrode and the drain electrode on the second GaN based semiconductor layer, the fourth GaN based semiconductor layer disposed separated from the third GaN based semiconductor layer;

a first insulating film disposed on the fourth GaN based semiconductor layer; and a first field plate electrode disposed interposing the first insulating film in a space with the fourth GaN based semiconductor layer, the first field plate electrode being separated from the fourth GaN based semiconductor layer, the first field plate electrode electrically connected to the source electrode, wherein the fourth GaN based semiconductor layer is located between the second GaN based semiconductor layer and a first end portion on the drain electrode side of the first field plate electrode, a line drawn from an exterior side surface of the first end portion vertical to an interface between the first GaN based semiconductor layer and the second GaN based semiconductor layer crosses the fourth GaN based semiconductor layer.

15. The device according to claim 14, wherein the fourth GaN based semiconductor layer is a floating layer.

16. The device according to claim 14, wherein the fourth GaN based semiconductor layer has an area density of an acceptor lower than an area density of two-dimensional electron gas generated at an interface between the first GaN based semiconductor layer and the second GaN based semiconductor layer.

17. The device according to claim 14, wherein an end portion of the fourth GaN based semiconductor layer is sloped.

18. The device according to claim 14, wherein the third GaN based semiconductor layer and the fourth GaN based semiconductor layer have a substantially same p-type impurity concentration, and the fourth GaN based semiconductor layer has a film thickness thinner than a film thickness of the third GaN based semiconductor layer.

19. The device according to claim 14, further comprising: a p-type fifth GaN based semiconductor layer disposed between the gate electrode and the fourth GaN based semiconductor layer or between the fourth GaN based semiconductor layer and the drain electrode, the fifth GaN based semiconductor layer disposed on the second GaN based semiconductor layer on an opposite side of the first GaN based semiconductor layer, the fifth GaN based semiconductor layer being separated from the third GaN based semiconductor layer and the fourth GaN based semiconductor layer.

20. The device according to claim 14, wherein the fourth GaN based semiconductor layer has a film thickness of 10 nm or more and 100 nm or less.

21. The device according to claim 1, wherein the first insulating film is disposed directly on the fourth GaN based semiconductor layer.

22. The device according to claim 14, wherein the first insulating film is disposed directly on the fourth GaN based semiconductor layer.

23. The device according to claim 1, wherein the p-type fourth GaN based semiconductor layer is made of p-type GaN.

24. The device according to claim 14, wherein the p-type fourth GaN based semiconductor layer is made of p-type GaN.

* * * * *